United States Patent [19]
Saiki et al.

[11] Patent Number: 6,018,197
[45] Date of Patent: Jan. 25, 2000

[54] WIRED BOARD WITH IMPROVED BONDING PADS

[75] Inventors: Hajime Saiki, Aichi; Kozo Yamasaki, Cifu, both of Japan

[73] Assignee: NGK Spark Plug Co., Ltd., Nagoya, Japan

[21] Appl. No.: 08/958,083

[22] Filed: Oct. 27, 1997

[30] Foreign Application Priority Data

Oct. 28, 1996 [JP] Japan ................................ 8-303967

[51] Int. Cl.⁷ .......................... H01L 23/48; H01L 23/52; H01L 29/40
[52] U.S. Cl. .......................... 257/784; 257/772; 257/779; 257/705; 257/738
[58] Field of Search ..................... 257/784, 700, 257/701, 703, 705, 772, 779, 780, 738; 438/613; 228/180.22

[56] References Cited

U.S. PATENT DOCUMENTS

| | | | |
|---|---|---|---|
| 4,067,039 | 1/1978 | Gaicki | 257/784 |
| 4,202,007 | 5/1980 | Dougherty et al. | 257/700 |
| 5,147,084 | 9/1992 | Behun et al. | 228/56.3 |
| 5,316,788 | 5/1994 | Dibble et al. | 427/98 |
| 5,714,801 | 2/1998 | Yano et al. | 257/691 |
| 5,801,446 | 9/1998 | DiStefano et al. | 257/772 |

FOREIGN PATENT DOCUMENTS

| | | |
|---|---|---|
| 0 657 932 A2 | 6/1995 | European Pat. Off. . |
| WO 96/09646 | 3/1996 | European Pat. Off. . |
| 0 746 188 A1 | 12/1996 | European Pat. Off. . |
| 8-107261 | 4/1996 | Japan . |
| 8-97325 | 4/1996 | Japan . |
| 8-264931 | 10/1996 | Japan . |

OTHER PUBLICATIONS

Patent Abstract of Japan, vol. 96, No. 006, Jun. 28, 1996.

Primary Examiner—Mahshid Saadat
Assistant Examiner—Jhihan B Clark
Attorney, Agent, or Firm—Foley & Lardner

[57] ABSTRACT

A wired ceramic board has on a main surface of a ceramic substrate thereof a plurality of bonding pads each of which has a projection having a solderable outer surface and positioned inside an outer periphery of each bonding pad when observed in a plan view. To each bonding pad is bonded a solder ball by using solder which is lower in melting point than the solder ball. The ceramic board and a resinous printed board are placed one upon another in such a manner that their bonding pads are aligned with each other. The bonding pads are soldered together with low melting point solder. The projection of each bonding pad is embedded in or surrounded by a mass of low melting point solder and joined with the mass of solder to constitute an integral unit while serving as a core of the unit. A shearing force acting on the assembly of the ceramic board and the plastic or resinous board parallel to the main surface of the ceramic board due to a temperature variation is applied by way of the mass of solder to the projection to be supported thereby, whereby to prevent initiation and growth of a crack or cracks in the mass of solder.

6 Claims, 9 Drawing Sheets

WIRED BOARD WITH IMPROVED BONDING PADS

BACKGROUND OF THE INVENTION

1. Field of the Invention

The present invention relates to a wired board (i.e., a board provided with interconnecting conductors or wiring) for use as, for example, a BGA (ball grid array) package base for IC (integrated circuit) packages and a plastic or resinous printed board (i.e., a board consisting of a substrate made of a resinous material) such as a motherboard and adapted to mount thereon the above described BGA package base or the like.

2. Description of the Related Art

A conventional wired board for a BGA package base includes a substrate made of an electrically insulating material such as alumina ceramic and a number of connection terminals or bumps formed on the main surface of the substrate. An example of such connection terminal is shown in FIG. 15 and generally indicated by 7'. Each connection terminal 7' includes a mass 5' of solder and a solder ball 6' bonded to a bonding pad 3' by way of the mass 5' of solder. The bonding pad 3' is formed on a main surface 2a' of a substrate 2' for metallizing the same and treated by a predetermined plating process. The mass 5' of solder consists of Pb-Sn eutectic solder or the like solder which is relatively low in melting point (hereinafter also referred to as low melting point solder). The solder ball 6' is made of solder which is relatively high in melting point (hereinafter also referred to as high melting point solder) and contains a high percentage of lead (Pb), as for example PB90–Sn10. The solder ball 6' is bonded to the plated surface of the bonding pad 3' by way of the mass 5' of solder, whereby to constitute the connection terminal 7'. In use, the wired board 1' is mounted on a printed board having bonding pads corresponding in arrangement to those of the wired board 1' in such a manner that their connection terminals are respectively aligned with each other, and then their terminals are bonded to each other, whereby the wired board 1' is electrically connected to the printed board. FIG. 16 shows an assembly of a wired board 1' for a BGA package base having such connection terminals 7' shown in FIG. 15 and a printed board 21' which are soldered together at their bonding pads 3' and 23'.

Such an assembly encounters the following problems. Namely, an assembly of a ceramic wired board or the like which is low in coefficient of thermal expansion and a plastic or resinous printed board which is high in coefficient of thermal expansion which are soldered together at their bonding pads (hereinafter also referred to simply as pads) has the possibility that due to the difference in expansion and contraction between the wired board 1' and the printed board 21' resulting from the difference in coefficient of thermal expansion between them a crack or cracks K are caused at the soldered interconnection portions (hereinafter also referred to as BGA interconnection portions) which are located between the bonding pads 3' and 23' as shown in FIGS. 17 and 18 to cause disconnection. This is because the solder is relative low in strength and is incapable of resisting or enduring the thermal stress or shearing stress parallel to the main surfaces of the wired board 1' and the printed board 21'. The stress becomes maximum at or adjacent an interface between each bonding pad 3' or 23' and the mass of solder.

The low melting point solder has the property of being hard to deform since it is more brittle and less ductile or malleable as compared with the high melting point solder. In addition, at the interface between the mass of low melting point solder and the bonding pad is formed an intermetallic compound of Au-Sn or Ni-Sn, which is hard and brittle, due to the diffusion caused between the Au-plated or Ni-plated layer on the bonding pad and tin (Sn) in the mass of solder. For this reason, when a large temperature variation occurs after assembly, initiation and growth of a crack or cracks K is liable to be caused in such a manner that a crack or cracks K initiate at a point on the outer periphery of each mass 5' of solder and extend therefrom along the main surfaces 2a' and 22a' of the substrates 2' and 22', while leaving solder layers of quite small thicknesses T1 and T2 on the respective pads 3' and 23', i.e., leaving a single thin solder layer on each of the pads 3' and 23' as shown in FIG. 18. Once such cracks K are caused, they are likely to be developed throughout the mass 5' of solder from the initiation point at one side to the other side at one time, thus causing the possibility that defective conduction or disconnection between the pads 3' and 23' is incurred.

This problem becomes more prominent as the difference in coefficient of thermal expansion between the materials of the substrates for the wired board and the printed board becomes larger and as the boards become larger in size. So, depending upon the size of the boards, there may occur such a problem that a ceramic wired board cannot be mounted on a plastic printed board. Further, there may be incurred such a problem that depending upon the material of one of the mating boards the material of the other is restricted or the size of the wired board cannot be increased.

In the meantime, the cracks between the pads naturally occur not only on the wired board 1' side but on the printed board 23' side in the similar manner as shown in FIGS. 17 and 18. However, in case, for example, a ceramic wired board and a plastic printed board are bonded together, there is a tendency that cracks are actually caused in the masses of solder at or adjacent the interface between each pad on the ceramic package base side and the corresponding mass of solder and scarcely at the interface between each pad on the plastic printed board and the corresponding solder. This is for the following reasons. The pad constituting the connection terminal of the ceramic wired board is comprised of a plated layer of several microns in thickness formed on a metallized layer of tungsten or the like, whereas the pad on the plastic or resinous printed board is made of copper and so thin, i.e., 20 to 30 μm, and above all things copper is considerably softer as compared with tungsten.

Accordingly, in case the pads of the wired board and the printed board are soldered together, the pads on the printed board side are thick and soft in itself so they are liable to deform to absorb the above described thermal stresses resulting from a temperature variation, whereas the pads on the ceramic wired board side are hard and thin so they can be hardly expected to effect such a stress absorbing action. For this reason, in many cases, cracks are caused at or adjacent the interface between the ceramic board side pad and its associated mass of solder.

SUMMARY OF THE INVENTION

In accordance with the present invention, there is provided a novel and improved wired board which comprises a substrate having a main surface, and a plurality of bonding pads each having a solderable outer surface, disposed on the main surface of the substrate. Each of the bonding pads has a projection having a solderable outer surface and positioned inside of an outer periphery thereof when observed in a plan view.

In the above aspect, in case the substrate of the wired board is made of alumina ceramic for instance, a mass of low melting point solder paste is applied onto each of the bonding pads by printing. On the mass of low melting point solder is mounted a solder ball which is higher in melting point than the mass of solder. The mass of low melting point solder is melting to connect the solder ball to the pad. In use, the wired board is mounted on a printed board having bonding pads with masses of low melting point solder corresponding in arrangement to those of the wired board in such a manner that their bonding pads are respectively aligned with each other, and the masses of low melting point solder between their bonding pads are melted to solder their pads together. By this, the projection of each bonding pad of the ceramic wired board is embedded in or surrounded by the mass of solder connecting between the mating pads of the both boards and become integral with the same, whereby to serve as a core of the mass of low melting point solder. The solder ball is disposed between the projection and the bonding pad of the printed board.

When such a BGA joint is subjected to a temperature variation, a shearing stress resulting from the difference in coefficient of thermal expansion and parallel to the main surface of the boards is applied to the projection by way of the mass of solder integral with the projection. Accordingly, crack initiation and growth otherwise likely to be caused at the interface between the ceramic board side and the pad in case such a projection is not provided, can be prevented effectively. Further, even when such a crack or cracks occur, their growth is stopped at one side of the projection and hardly continues to allow the crack or cracks to be extended further to the other side of same, so there is hardly caused the possibility of disconnection. In the meantime, the projection can be one or plural in number to attain the invention.

It is considered that in case the possibility of crack initiation and growth adjacent the pads of the ceramic wired board is eliminated it will inversely caused the possibility of such crack initiation and growth adjacent the pads of the plastic printed board. However, as described above, the pads on the plastic printed board side are generally softer and thicker as compared with those on the ceramic board side and capable of absorbing the stresses by themselves, so there is little possibility of a crack or cracks being caused adjacent the pads of the plastic printed board. If the present invention is embodied in the both boards to be joined together, the possibility of disconnection can be made further smaller, thus making it possible to increase the reliability further.

The above described projection is shaped suitably depending upon the kind, material, plane figure (i.e., shape of main surface) of the wired board. The design of the projection in plane figure (i.e., cross sectional shape), dimensions (diameter), height, number and location on the pad can be made suitable depending upon the wired board, the pad thereof and the material of the projection. The material of the projection can be designed suitably depending upon the material of the wired board. For example, in case the substrate of the wired board is made of ceramic, the projection can be made of tungsten, molybdenum or the like in its entirety. In such a case, a pad with a projection can be formed by applying a mass of metallic paste of a relatively high viscosity onto each pad by printing and firing it. Further, the projection can be formed by a ceramic body having on the outer surface thereof a metallic layer. In case of the ceramic wired board, each projection is formed by first preparing a green ceramic projection and attaching it to a green ceramic board having conductive layers for interconnecting conductors or wiring therewithin, applying a layer of tungsten paste onto the green ceramic projection by printing or the like, co-firing the green ceramic board, green ceramic projection, etc., and thereafter plating the projection to form on the outer surface thereof a solderable pated layer. In this instance, the projection and the solderable plated layer thereon can be formed by using substantially the same process of forming the conventional ceramic wired substrate for the ceramic package base. Further, in case of the plastic wired board, the projection including the surface portion, i.e., the entire of the projection can be formed by solderable metal. For example, in case the pad is formed by Cu-plating, the projection can be formed by Cu-plating the pad once again after the pad has been formed.

Further, the wired board of this invention can have a solderable metallic ball bonded to each bonding pad with solder which is lower in melting point than the metallic ball, to serve as a connection terminal, that is, the wired board of this invention can have a two-layer joint structure in which a high melting point solder ball or copper ball is bonded to each bonding pad with a low melting point solder so that the soldered joint is prevented from collapsing due to melting of all the masses of solder in assembly with a printed board or the like. In place of such a metallic ball, it will do to use a nearly semispherical or spherical mass of solder which is bonded to each bonding pad. For the solder, it will do to select suitable one from alloys containing lead (Pb) and tin (Sn) as major components (i.e., Pb-Sn alloys), that is, for the low melting point solder, it will do to select suitable one from alloys containing low percentages of Pb (i.e., high percentages of Sn).

In the meantime, in case a mass of solder is bonded to each bonding pad in place of a metallic ball, it is desirable to use a high melting point solder having high percentages of Pb. As the solder has a higher melting point, i.e., the percentage of Pb component becomes higher, the solder becomes softer and more ductile or malleable while at the same time its recrystallization temperature becomes closer to the ordinary or room temperature and it can absorb the stress resulting from the difference in coefficient of thermal expansion more easily and readily, so even if a crack or cracks are caused the mass of solder is deformed easily to prevent further growth of the crack or cracks.

The above structure is effective for solving the above noted problems inherent in the prior art device.

It is accordingly an object of the present invention to provide a novel and improved wired board which can effectively prevent initiation and growth of a crack or cracks in masses of solder for connection between bonding pads of mating wired boards, e.g., a ceramic board and a plastic or resinous board which differ largely in coefficient of thermal expansion, particularly in case the boards are connected by the BGA (ball grid array) interconnection technology.

It is a further object of the present invention to provide a novel and improved wired board of the foregoing character which makes it possible to eliminate or at least reduce the possibility of disconnection between the mating pads (i.e., defective connection) and attain a highly reliable soldered BGA joint.

DETAILED DESCRIPTION OF THE PREFERRED EMBODIMENTS

Figure 1:
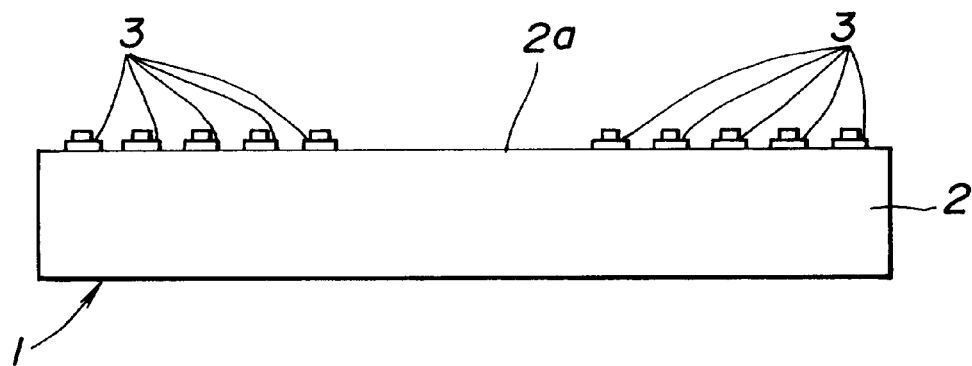
FIG. 1 is a schematic side elevational view of a wired board for use as a BGA package base according to an embodiment of the present invention.
Figure 2:
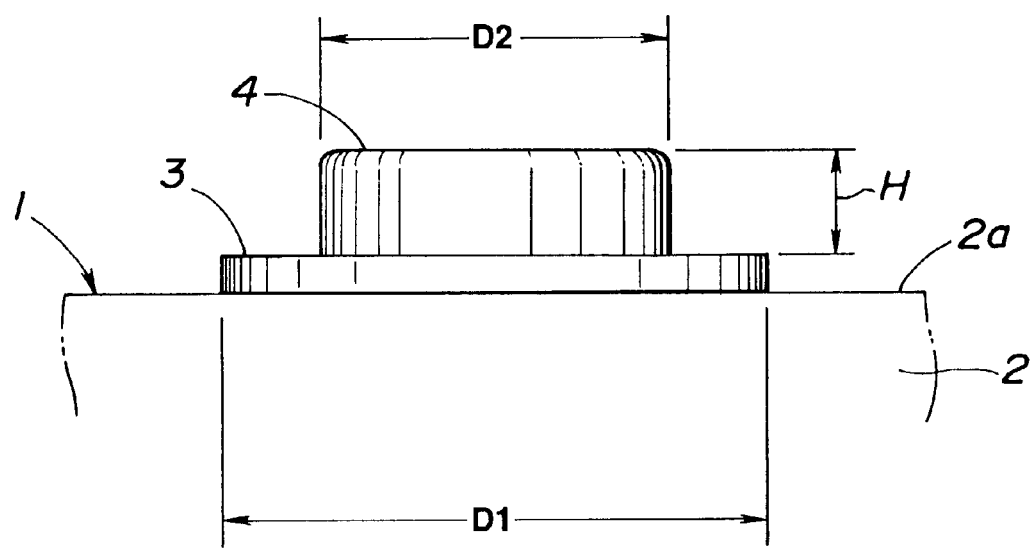
FIG. 2 is an enlarged side elevational view of a bonding pad of FIG. 1.
Figure 3:
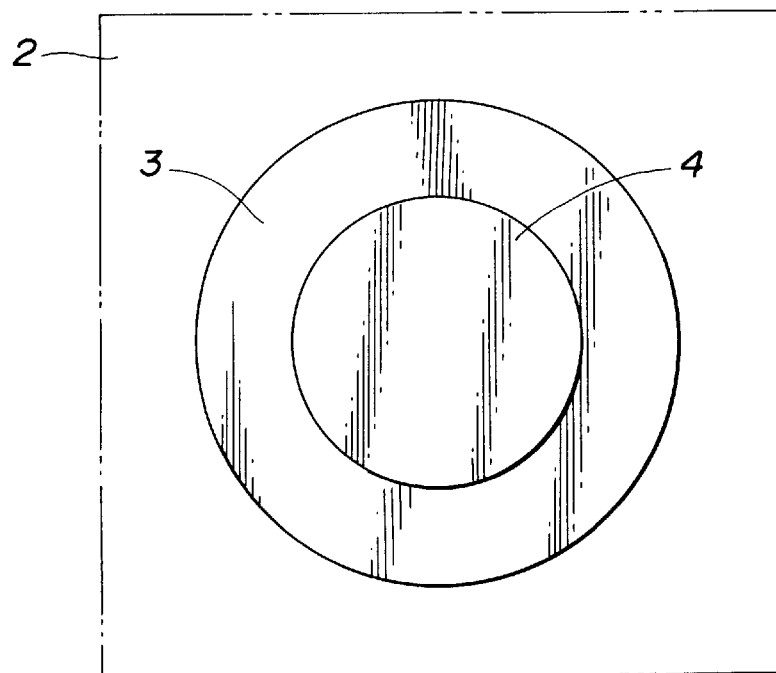
FIG. 3 is a plan view of the bonding pad of FIG. 2.

Referring now to FIGS. 1 to 3, a wired board for use as a BGA package base according to an embodiment of the present invention is generally indicated by 1 and includes a substrate 2 made of alumina ceramic and a number of bonding pads 3 disposed in a predetermined pattern or arrays on a main surface 2a of the substrate 2. The pads 3 have a nearly circular shape when observed in a plan view and are made of a metal which is solderable, i.e., wettable by solder. In this embodiment, each pad 3 has an inverted T-shaped longitudinal section or in the form of a stepped cylinder, i.e., each pad 3 has at the nearly central part of the upper surface thereof a projection 4 in the form of a cylinder or disk of a predetermined height. In this embodiment, the diameter D1 of the pad 3 is 860 μm, the diameter D2 of the projection 4 is 430 μm, and the height H is in the range from 40 to 49 μm. In the meantime, each pad 3 is electrically connected to an internal conductive network or wiring (not shown) within the base 1, and the entire surface of the pad 3 including the surface of the projection 4 is plated with Ni and Au.

Figure 4:
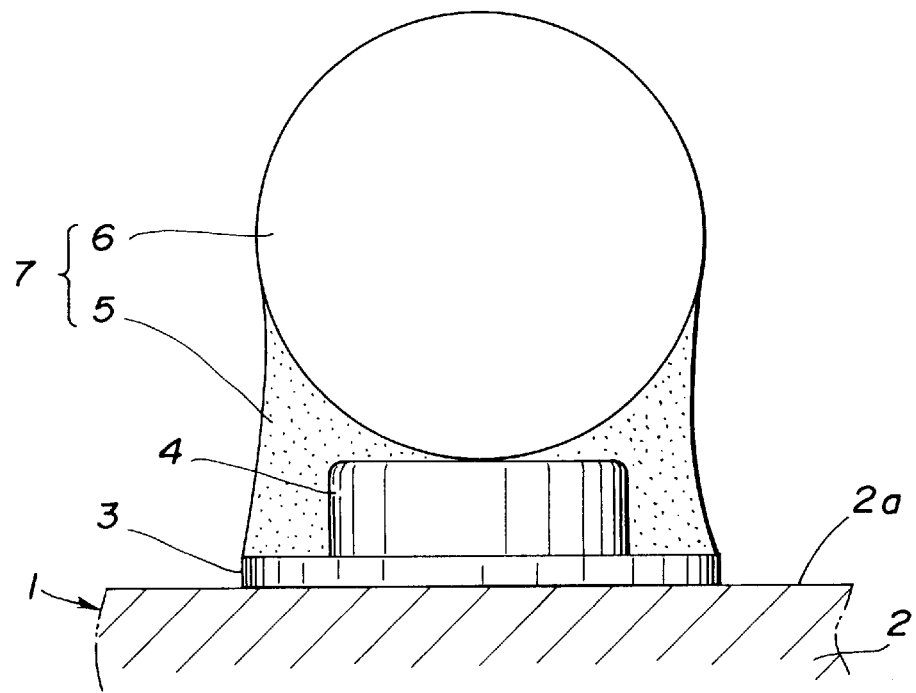
FIG. 4 is a schematic sectional view, partly in elevation, of the bonding pad of FIG. 2, together with a solder ball bonded thereto by way of a mass of low melting point solder.

As shown in FIG. 4, to the Au-plated layer (not shown) over the surface of the pad 3 and the projection 4 is bonded by way of a mass 5 of low melting point solder (e.g., Pb-Sn eutectic solder) to a solder ball 6 which is made of solder higher in melting point than the mass 5 of solder, whereby to constitute the ceramic wired board or ceramic package base 1 provided with a number of connection terminals or bumps 7.

Figure 5:
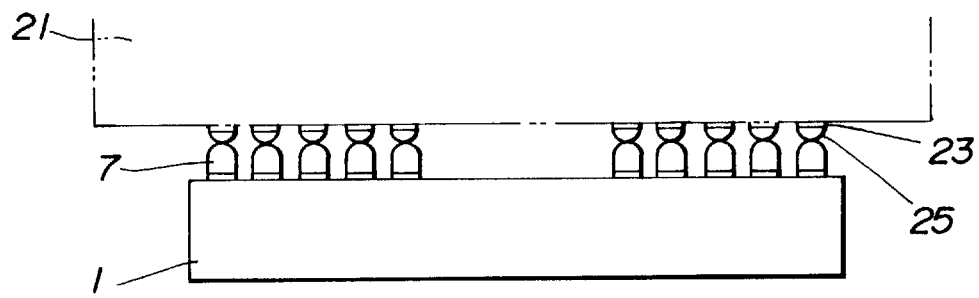
FIG. 5 is a schematic side elevational view of the wired board for the BGA package base, having bonded thereto solder balls, together with a printed circuit board.
Figure 6:
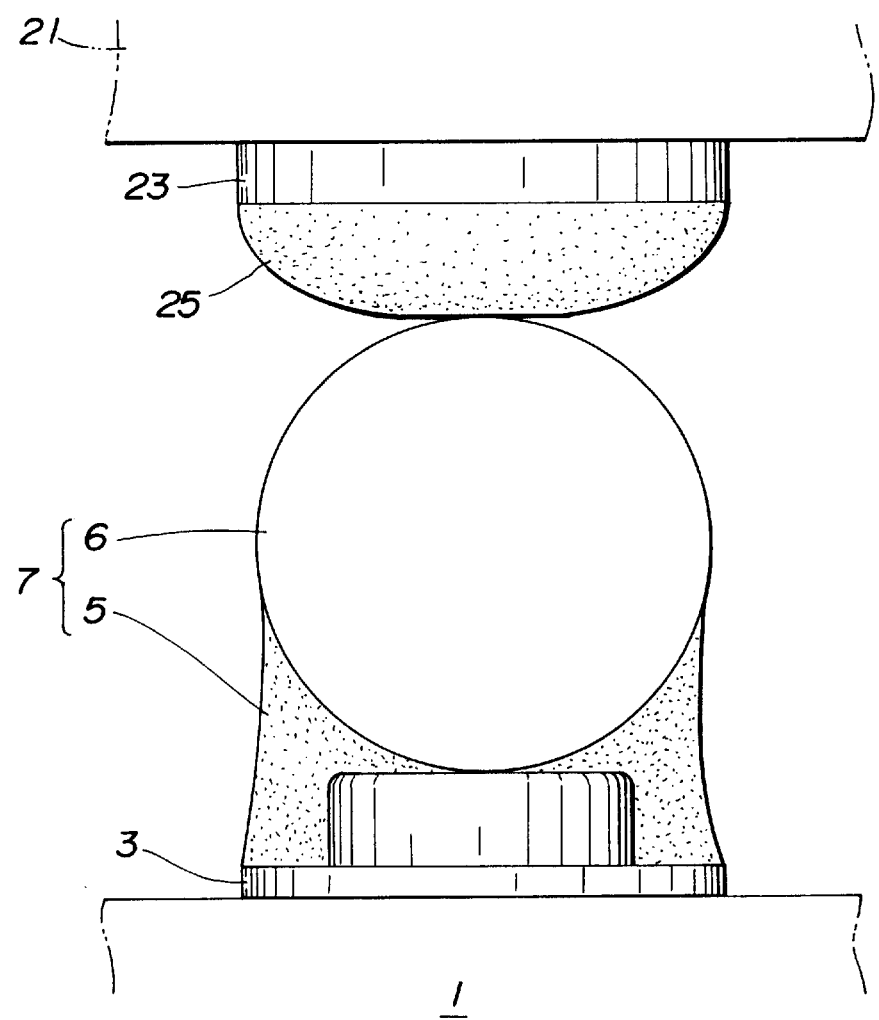
FIG. 6 is an enlarged sectional view, partly in elevation, of a portion of FIG. 5 and shows the BGA interconnection portions of the wired board and the printed circuit board which are placed one upon another.

Referring to FIGS. 5 and 6, such a ceramic wired board 1 and a conventional plastic or resinous printed board (e.g., a glass-epoxy printed board) 21 having a number of bonding pads 23 which are made of copper and arranged correspondingly to the connection terminals 7 as shown in FIG. 5 are placed one upon another in such a manner that the bonding pads 3 and 23 are positioned so as to face each other, i.e., aligned with each other, respectively, and then heated to melt the masses 5 and 25 of low melting point solder. Whereupon, as shown in FIG. 7, the bonding pads 3 and 23 are soldered together by way of the masses 5 and 25 of low melting point solder and the solder ball 6, whereby each solder ball 6 is held between the upper surface 4a of the projection 4 of the pad 3 of the ceramic wired board 1 and the pad 23 of the plastic or resinous printed board 21, and a soldered BGA joint in which the projection 4 is embedded in or surrounded by the mass 5 of low melting point solder is obtained.

Figure 7:
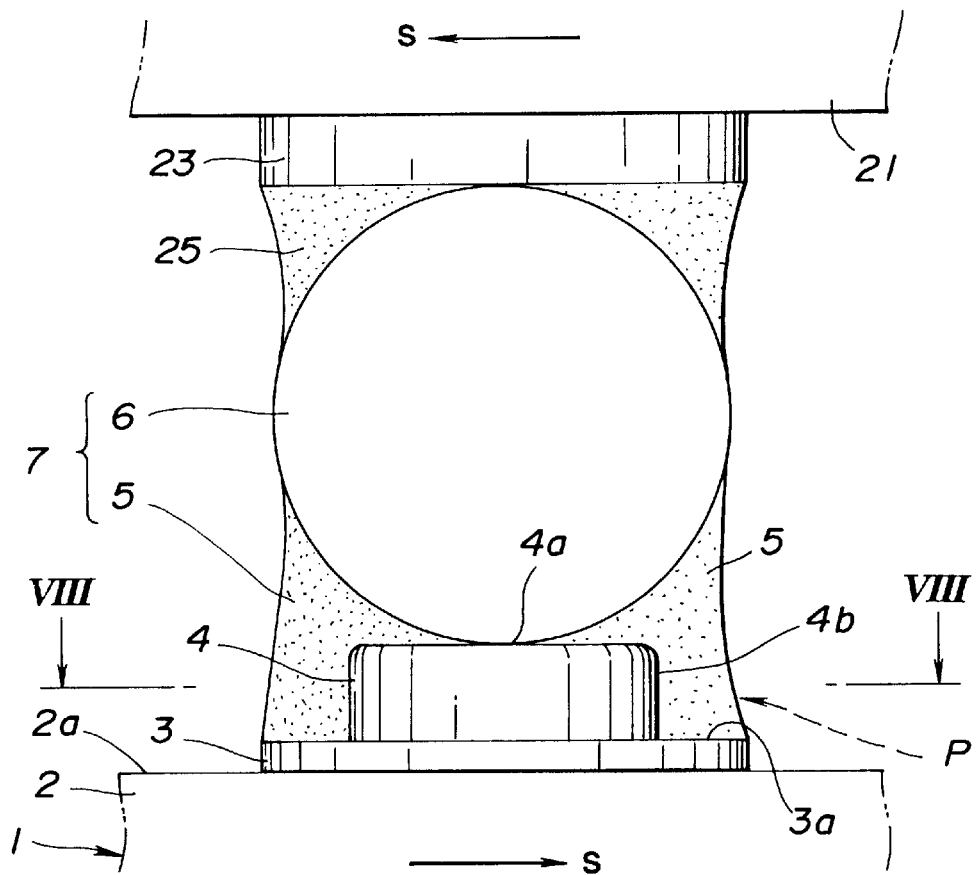
FIG. 7 is a schematic sectional view, partly in elevation, of the soldered BGA joint of FIG. 6.
Figure 8:
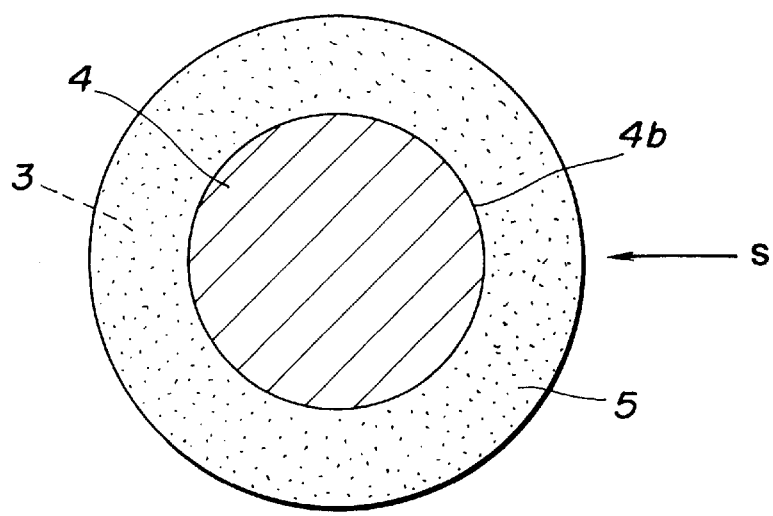
FIG. 8 is a sectional view taken along the line VIII—VIII of FIG. 7.
Figure 9:
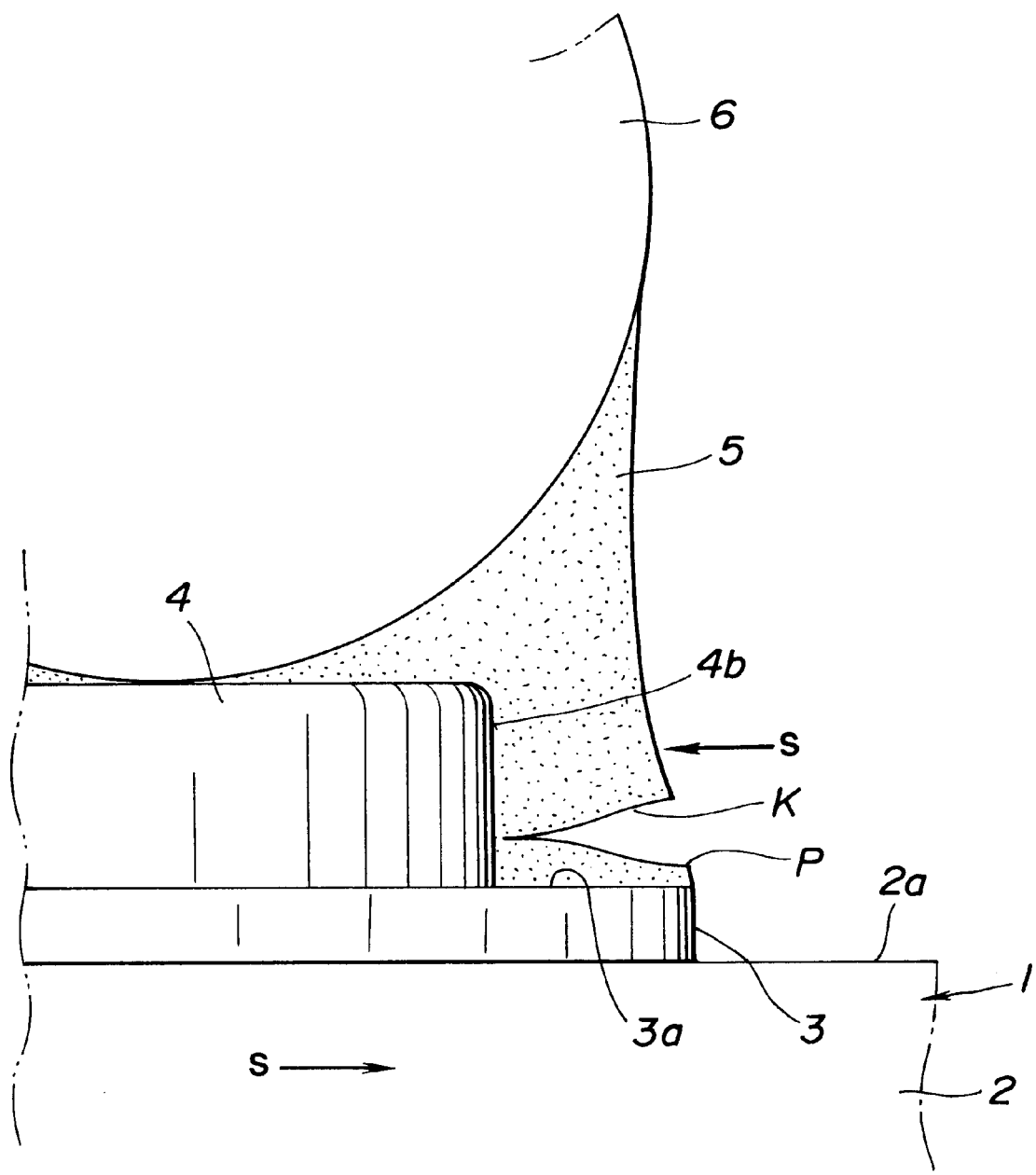
FIG. 9 is an illustration of how a crack occurs and its growth is stopped.

When the assembly of the ceramic board 1 and plastic or resinous board 21 bonded together in the above described manner is subjected to a temperature variation, shearing forces S parallel to the main surface 2a of the substrate 2 of the wired board 1 act on the assembly as indicated by the arrows in FIG. 7. On the other hand, since the pad 3 has on the upper surface 3a thereof the integral projection 4 which is bonded to the mass 5 of low melting point solder to constitute an integral unit therewith while serving as a core of the mass of solder 5, the choaring forces E are applied through the mass 5 of low melting point solder to the side surface 4b of the projection 4 to be supported thereby. Since the shearing forces S are supported by the projection 4, initiation and growth of a crack liable to occur at a point indicated by P in FIG. 7, i.e., at a point located on the outer periphery of the mass 5 of solder and adjacent the interface between the upper surface 3a of the pad 3, which is positioned at the root of the projection 4, and the mass 5 of low melting point solder, can be prevented. As shown in FIG. 9, if a crack K is caused in a way as to have an initiation point adjacent the above described interface, its growth is interrupted or obstructed by the projection 4, thus making it possible to prevent disconnection.

Referring to FIGS. 10A–10F, a method of making such a wired board 1 and connection terminal 7 will be described. Firstly, a ceramic green sheet 11 having conductive layers for internal network or wiring therewithin is prepared (refer to FIG. 10-A). At predetermined positions on the green sheet 11, i.e., at positions where bonding pads are to be formed, are applied by printing or the like and in accordance with the shape of the bonding pad, masses 13 of metallizing paste (hereinafter also called pad) composed of high melting point metal such as tungsten (refer to FIG. 10-B). At the center of the upper surface of each pad 13 is placed a cylindrical or disk-shaped green ceramic body 14 of the height corresponding to that of the projection 4 (refer to FIG. 10-C), and to the upper and side (circumferential) surface of the green ceramic body 14 is applied the layer 14a of similar metallizing paste to that of the pad 13 (refer to FIG. 10-D). The green sheet 11, pads 13, green ceramic bodies 14, etc. are then dried and co-fired at one time or all together. By this, there is formed the ceramic wired board 1 having on the main surface 2a of the substrate 2 of the bonding pads 3 each having on the upper surface thereof a projection composed of the ceramic body 14 and the metallizing layer 14a covering the outer surface of the ceramic body 14.

Figure 10:
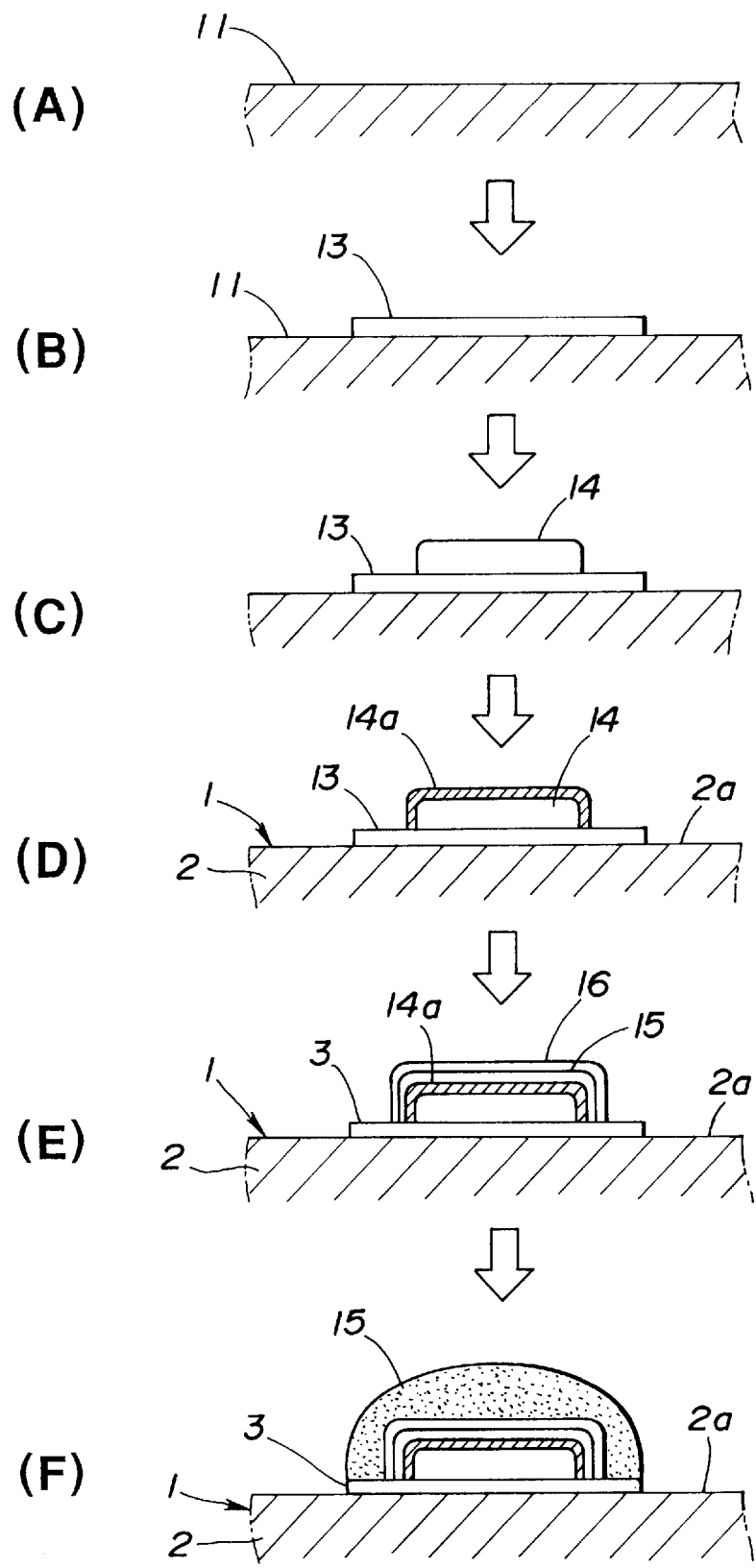
FIGS. 10A–10F are an illustration of a process of making a wired board and its bonding pad.

Then, on the outer surface of each bonding pad 3 are formed a Ni-plated layer 15 and a Au-plated layer 16 for thereby forming a desired bonding pad 3 (refer to FIG. 10-E). On the outer surface of each bonding pad 3 is applied a mass 15 of low melting point solder paste by printing or the like (refer to FIG. 10-F). Further, on each mass 15 of low melting point solder paste is placed a high melting point solder ball, and then the mass 15 of low melting point solder paste and the high melting point ball are heated at, for example, 220° C. for thereby reflowing only the mass 15 of low melting point solder and bonding the high melting point solder ball to the bonding pad 3, whereby the wired board 1 having a plurality of connection terminals 7 each including the high melting point solder ball 6 bonded onto the pad 3 as shown in FIG. 4 is obtained.

In the foregoing, the operation of the ceramic wired board 1 has been described with respect to the case in which the wired board 1 is mounted on a conventional plastic or resinous printed board 21 (i.e., a board having a substrate made of a resinous material). However, the present invention can also be embodied in such a printed board 21. In case the ceramic board 1 of the above described embodiment is mounted on the printed board 21 in which the present invention is embodied, initiation and growth of a crack or cracks in the masses 5 and 25 of low melting point solder interconnecting the ceramic board 1 and the printed board 21 can be prevented further effectively.

Figure 11:
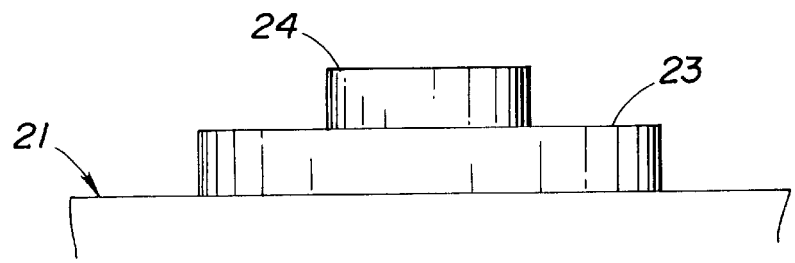
FIG. 11 is an enlarged side elevational view of a bonding pad of a plastic or resinous printed board.

In the meantime, the present invention can be embodied in a glass-epoxy printed board as follows. In case the pads 23 are formed on a glass-epoxy printed board 21 shown in FIG. 11 by Cu-plating, the printed board 21 is first formed with a mask or a plating resist (not shown) having a predetermined pattern and then Cu-plated for thereby forming the flattened portions of the pads 23. Thereafter, each pad 23 is further formed with, on the upper surface of the flattened portion thereof, a mask or a plating resist having a pattern corresponding to the shape and arrangement of a desired projection and further Cu-plated layer for thereby forming the projection 24 on the flattened portion of each pad 23. The mask or plating resist can be formed by a known technology, i.e., by using a known photosensitive material and processing it by exposure and development. By this, the projection 24 of the height corresponding to the thickness of the plated layer can be formed on each pad 23. By removing the resist, the printed board 21 having the bonding pads 23 solderable or wettable by solder and each having the projection 24 solderable or wettable by solder is formed. Thereafter, on each pad 23 and projection 24 are formed a Ni-plated layer and a Au-plated layer, whereby a desired bonding pad can be formed. Then, on the pads 23 are applied by printing masses of low melting point solder, and by reflowing the solder the connection terminals or bumps are obtained. In the meantime, the present invention can be embodied in a resinous package base in the similar manner as described above.

In the foregoing, while the connection terminal has been described and shown as using a high melting point solder ball or solder bump, it will be understood that another metallic ball can be used in place of the solder ball. In such a case, it will do to use a Cu ball in place of the solder ball, and further it will do to apply a coating of low melting point solder to the outer surface of the Cu ball in order to make higher the wettability by solder.

It will be further understood that a mass of one kind of solder formed into a nearly semispherical shape or nearly spherical shape can be used as a connection terminal in place of such a metallic ball. For example, it will do to use, without using low melting point solder, only high melting point solder for forming it into a nearly semispherical or nearly spherical and disposing it in place by the printing and plating technologies. However, in case of forming a connection terminal on the surface of the bonding pad without a metallic ball, it is necessary to use a gap retaining or holding means at the time of bonding of the mating pads, i.e., at the time of assembly of the mating boards.

In the foregoing, while the projection has been described and shown as being cylindrical or disk-shaped, it can be formed into a pillar having a square or rectangular cross section, a square or rectangular plate, a tubular shape or an annular shape.

Further, while each bonding pad has been described and shown as having one projection, the projection can be designed variously in number, plane arrangement, three-dimensional arrangement and combination depending upon the wired board, provided that the projection or projections are located on the upper surface of the bonding pad and inside the outer periphery of the same while having a solderable outer surface. Further, while a higher projection is more desirable, it is generally suitable to set the height of the projection to be within the range from 30 to 100 μm. Further, when the bonding pad is provided with only one projection, it is desirable to dispose the projection at the center of the bonding pad. However, the plane size of the projection can be designed suitably depending upon the size of the plane figure of the bonding pad (i.e., the diameter of the bonding pad), the resulting shear stress, etc.

Figure 12:
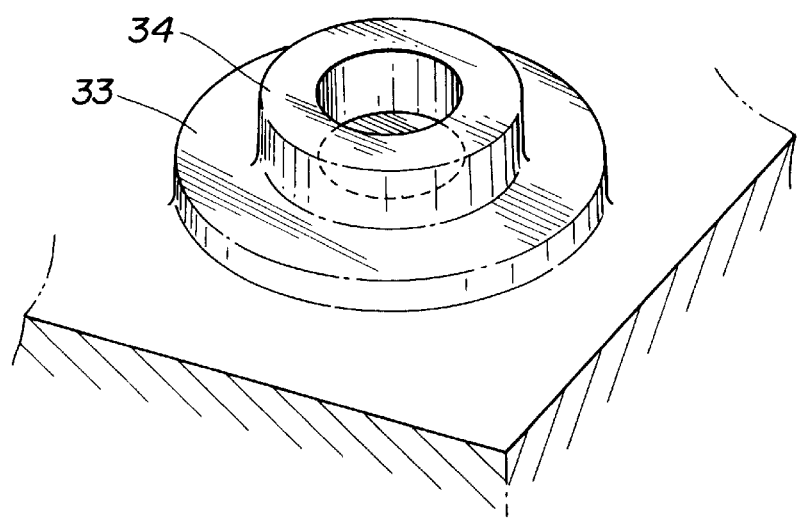
FIG. 12 is a perspective view of a variant of the bonding pad of FIGS. 1 and 11.
Figure 13:
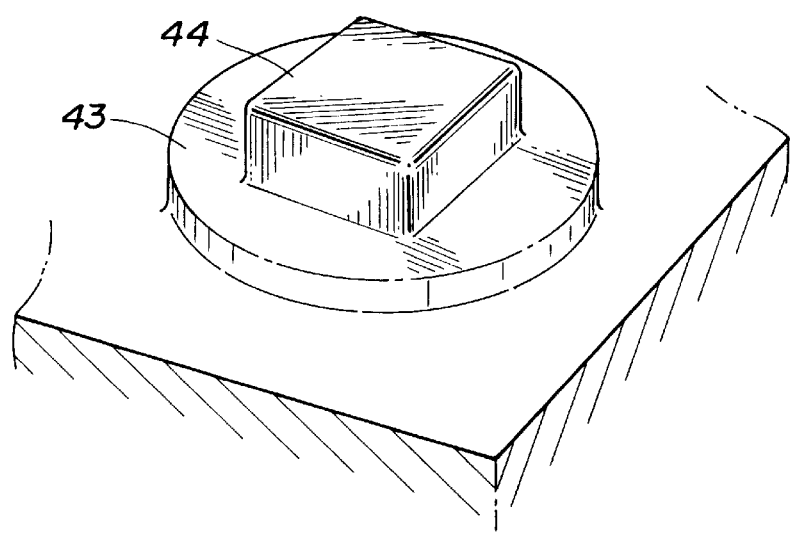
FIG. 13 is another variant of the bonding pad of FIGS. 1 and 11.
Figure 14:
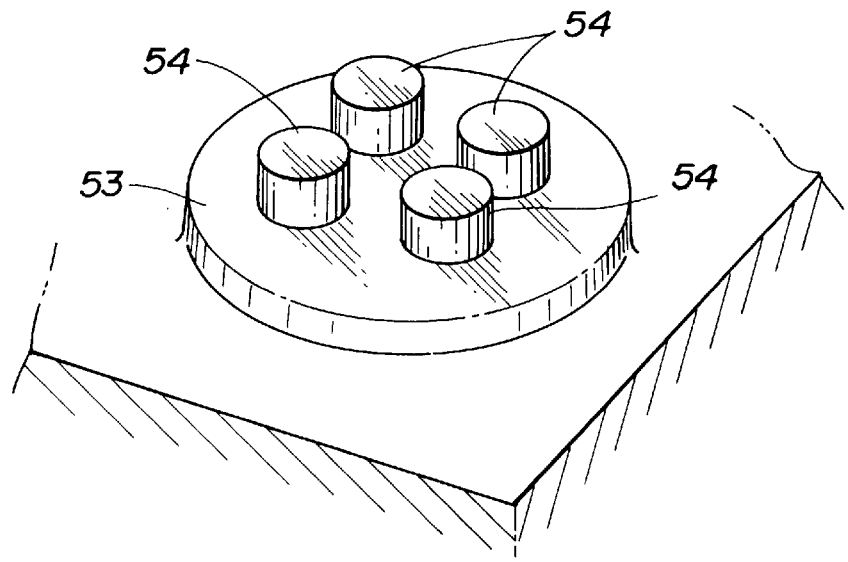
FIG. 14 is a further variant of the bonding pad of FIGS. 1 and 11.
Figure 15:
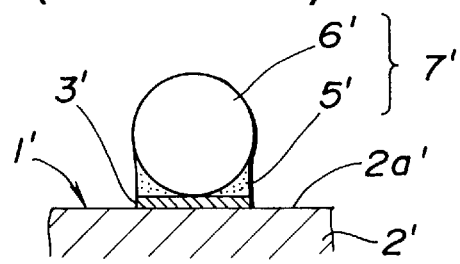
FIG. 15 is a sectional view of a bonding pad of a prior art BGA package base.
Figure 16:
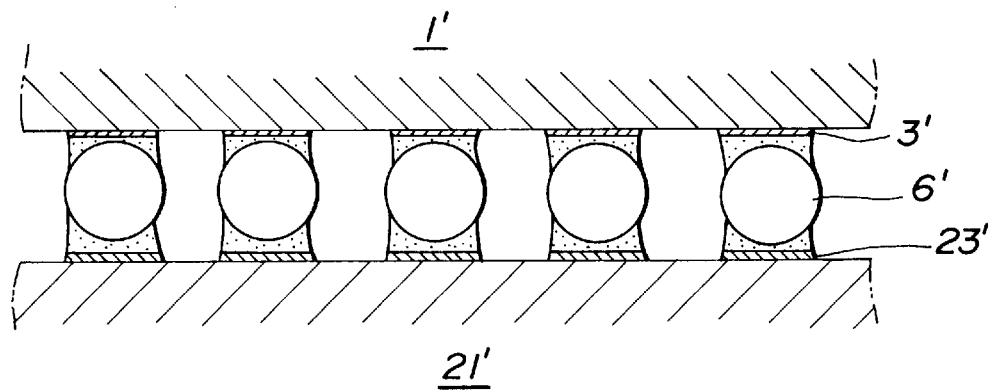
FIG. 16 is a fragmentary sectional view of a prior art wired board for use as a BGA package base, bonded to a printed board by the BGA interconnection technology.
Figure 17:
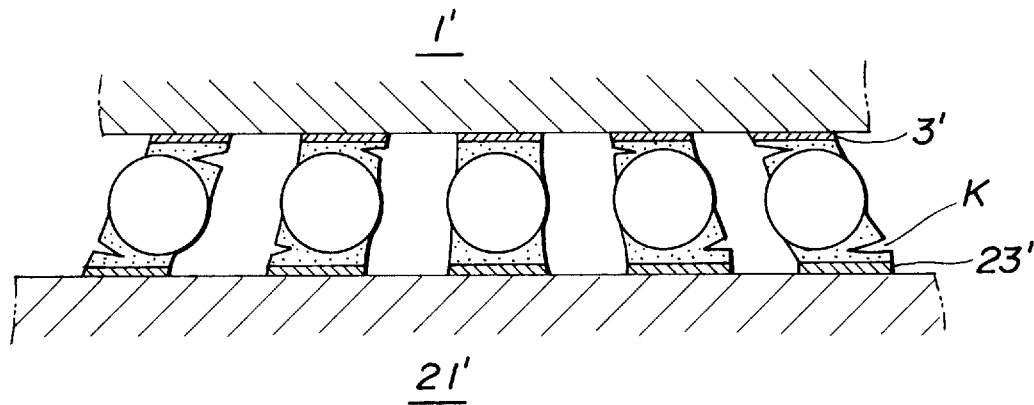
FIG. 17 is an illustration of cracks occurring in the masses of solder of the assembly of FIG. 16 due to a temperature variation.
Figure 18:
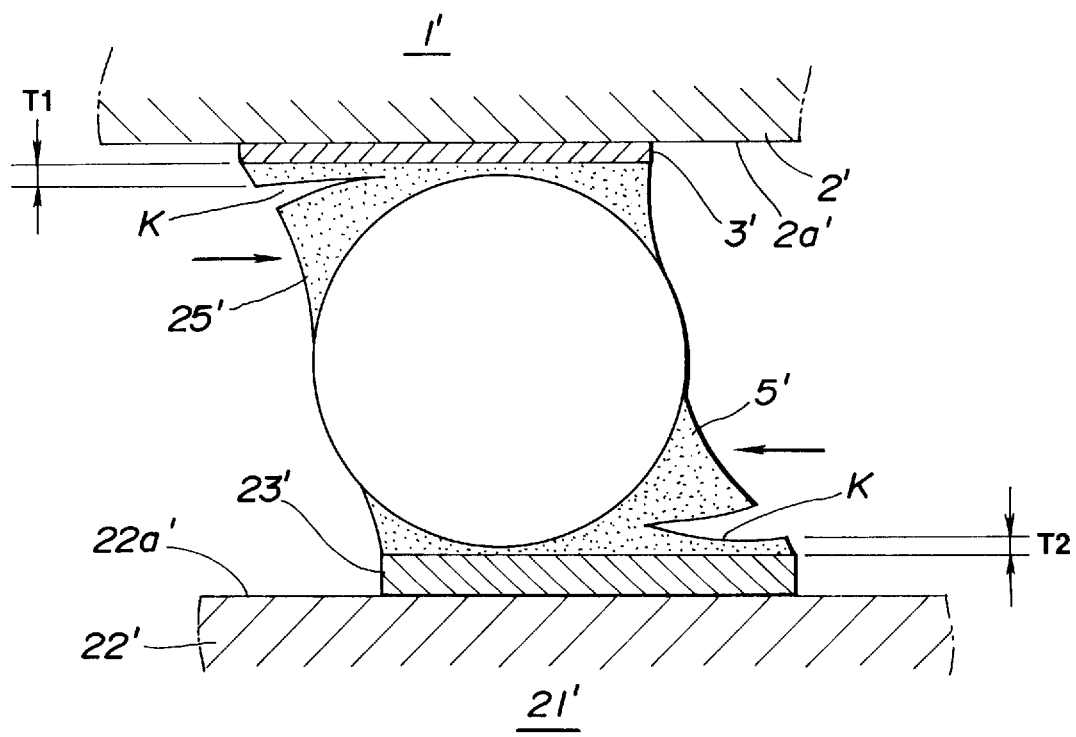
FIG. 18 an enlarged view of a portion of FIG. 17.

FIG. 12 shows a projection 34 which is ring-shaped or hollow, cylindrical and is formed on the central part of a pad 33. FIG. 13 shows a projection 44 which is formed into a square pillar or square plate and is formed at the central part of a pad 43. FIG. 14 shows a plurality of projections 54 which are formed on the upper surface of each pad 53. The projections 54 are cylindrical, and four projections 54 are provided and disposed with equal intervals. Each of the projections will become a core of a mass of solder and be joined with the mass of solder to constitute an integral unit after assembly by soldering, so the projection or projections support the shearing force which is applied thereto by way of the mass of solder, whereby a crack or cracks hardly occur or initiate and even if a crack or cracks occur or initiate their growth is stopped or interrupted by the projection or projections.

While the present invention has been described and shown as being embodied in a wired board for use as a ceramic package base and a plastic or resinous printed board, the present invention is not limited to a wired board of such kind and material but can be applied to various kinds of wired boards, provided that the mating wired boards are to be joined together by the BGA bonding technology even if they differ largely in coefficient of thermal expansion.

What is claimed is:

1. A ball grid array wired board comprising:
   a substrate having a main surface; and
   a plurality of bonding pads each having a solderable outer surface, disposed on said main surface of said substrate;
   each of said bonding pads having a projection having a solderable outer surface and positioned inside of an outer periphery thereof when observed in a plan view.

2. A wired board comprising:
   a substrate having a main surface; and
   a plurality of bonding pads each having a solderable outer surface, disposed on said main surface of said substrate;
   each of said bonding pads having a projection having a solderable outer surface and positioned inside of an outer periphery thereof when observed in a plan view;

wherein said projection comprises a ceramic body and a metallic layer formed on an outer surface of said ceramic body.

3. A wired board comprising:

a substrate having a main surface;

a plurality of bonding pads each having a solderable outer surface, disposed on said main surface of said substrate;

each of said bonding pads having a projection having a solderable outer surface and positioned inside of an outer periphery thereof when observed in a plan view; and a plurality of solderable metallic balls each bonded to each of said bonding pads with low melting point solder which is lower in melting point than said metallic balls.

4. A BGA package base comprising:

a ceramic substrate having a main surface;

a plurality of bonding pads each having an outer surface wettable by solder, disposed on said main surface of said substrate;

each of said bonding pads having an integral axial projection having an outer surface wettable by solder; and a plurality of metallic balls each soldered to each of said bonding pads with a mass of solder which is lower in melting point than said metallic balls;

each of said solder balls being disposed on said projection of each of said bonding pads;

said projection of each of said bonding pads being embedded in said mass of solder to serve as a core of said mass of solder.

5. A wired board comprising:

a substrate made of a resinous material and having a main surface; and a plurality of bonding pads each having an outer surface wettable by solder, disposed on said main surface of said substrate;

each of said bonding pads having an integral axial projection having an outer surface wettable by solder;

said projection of each of said bonding pads being a plated layer of metal.

6. An assembly comprising:

a ceramic wired board having a substrate made of ceramic and having a main surface, and a plurality of bonding pads disposed on said main surface of said substrate;

a resinous wired board having a substrate made of a resinous material and having a main surface and a plurality of bonding pads disposed on said main surface of said substrate in such a way as to have a corresponding arrangement to those of said ceramic wire substrate;

at least one of a group of said bonding pads of said ceramic wired substrate and a group of said bonding pads of said resinous wired board having integral axial projections, respectively;

said ceramic wired board and said resinous wired board being placed one upon another in such a manner that said bonding pads of said ceramic wired board are aligned with said bonding pads of said resinous wired board, respectively; and a plurality metallic balls each disposed between a mating pair of said bonding pads of said ceramic wired board and said bonding pads of said resinous wired board;

each of said metallic balls being soldered to a corresponding pair of said bonding pads of said ceramic wired board and said bonding pads of said resinous wired board with solder which is lower in melting point than said metallic balls.

* * * * *